(12) United States Patent
Maehara

(10) Patent No.: US 8,131,249 B2
(45) Date of Patent: Mar. 6, 2012

(54) FREQUENCY CONVERTER

(75) Inventor: Hiroki Maehara, Mitaka (JP)

(73) Assignee: Canon Anelva Corporation, Kawasaki-shi (JP)

( * ) Notice: Subject to any disclaimer, the term of this patent is extended or adjusted under 35 U.S.C. 154(b) by 184 days.

(21) Appl. No.: 12/720,823

(22) Filed: Mar. 10, 2010

(65) Prior Publication Data

US 2011/0051481 A1  Mar. 3, 2011

Related U.S. Application Data

(63) Continuation of application No. PCT/JP2009/065304, filed on Sep. 2, 2009.

(51) Int. Cl.
*H04B 1/26* (2006.01)
(52) U.S. Cl. .................. 455/325; 455/318; 455/327
(58) Field of Classification Search .............. 455/317, 455/318, 319, 323, 324, 325, 327, 333; 327/113, 327/115, 355
See application file for complete search history.

(56) References Cited

U.S. PATENT DOCUMENTS

| | | | | |
|---|---|---|---|---|
| 4,704,739 A * | 11/1987 | Murakami et al. | ............ | 455/325 |
| 5,630,225 A * | 5/1997 | Corman | ............ | 455/302 |
| 6,529,720 B1 * | 3/2003 | Jovenin et al. | ............ | 455/318 |
| 2007/0109147 A1 | 5/2007 | Fukuzawa et al. | ............ | 340/903 |
| 2008/0129401 A1 | 6/2008 | Fukuzawa et al. | ............ | 331/157 |
| 2008/0150643 A1 | 6/2008 | Suzuki et al. | ............ | 331/107 R |
| 2009/0243698 A1 | 10/2009 | Kakinuma et al. | ............ | 327/356 |
| 2010/0264959 A1 * | 10/2010 | Maehara | ............ | 327/113 |

FOREIGN PATENT DOCUMENTS

| | | |
|---|---|---|
| JP | 7-321514 A | 12/1995 |
| JP | 2006-295908 A | 10/2006 |
| JP | 2007-124340 A | 5/2007 |
| JP | 2007-235119 A | 9/2007 |
| JP | 2009-246615 A | 10/2009 |

OTHER PUBLICATIONS

J.C. Slonczewski, "Current-driven excitation of magnetic multilayers," Journal of Magnetism and Magnetic Materials, vol. 159 (1996) pp. L1-L7.
A.A. Tulapurkar et al., "Spin-torque diode effect in magnetic tunnel junctions," Nature, vol. 438 (Nov. 17, 2005) pp. 339-342 and "Supplemental discussion" appended at end (3 pages).

(Continued)

*Primary Examiner* — Thanh Le
(74) *Attorney, Agent, or Firm* — Fitzpatrick, Cella, Harper & Scinto

(57) ABSTRACT

The present invention provides a frequency converter including a frequency conversion device capable of accommodating a Si-series MMIC and also a GaAs-series MMIC by using a magneto-resistance element. A frequency converter according to an embodiment of the present invention includes: a frequency conversion device having a magneto-resistance element with a magnetization free layer, an intermediate layer, and a magnetization pinned layer; a magnetic field application mechanism for applying a magnetic field to the frequency conversion device; a local oscillator for applying a local oscillation signal to the frequency conversion device; and an input terminal electrically connected to the above frequency conversion device for receiving an external input signal. Further, the local oscillator includes a magneto-resistance element capable of generating the local oscillation signal by outputting an AC voltage according to a resistance change thereof.

6 Claims, 12 Drawing Sheets

OTHER PUBLICATIONS

J.C. Slonczewski, "Current-driven excitation of magnetic multilayers," Journal of Magnetism and Magnetic Materials, vol. 159, pp. L1-L7 (1996).

A.A. Tulapurkar, et al., "Spin-torque diode effect in magnetic tunnel junctions," Nature, vol. 438, pp. 339-342 (Nov. 17, 2005).

Y. Suzuki et al., "Dynamics of Spin Injection Magnetization Reversal and Microwave Emission/Rectification," Extended Abstracts of the 53$^{rd}$ Spring Meeting of the Japan Society of Applied Physics and Related Societies, 23p-ZM-5, p. 40 (Mar. 22-26, 2006).

K. Yakushiji et al. "Improvement of High Frequency Transmission Property and Spin-Torque Diode Effect in MgO-MTJs", Extended Abstracts of the 54$^{th}$ Spring Meeting of the Japan Society of Applied Physics and Related Societies, 30a-ZT-7, p. 531 (Mar. 27-30, 2007).

* cited by examiner

FREQUENCY CONVERTER

CROSS-REFERENCES TO RELATED APPLICATIONS

This application is a continuation application of International Application No. PCT/JP2009/065304, filed on Sep. 2, 2009, the entire contents of which are incorporated by reference herein.

BACKGROUND OF THE INVENTION

1. Field of the Invention

The present invention relates to frequency converter used in a radio communication apparatus or the like for performing frequency conversion.

2. Related Background Art

A non-linear element such as a semiconductor diode and FET has been used for a conventional frequency conversion device. The purpose of the frequency conversion is to input a signal having a certain frequency into a frequency conversion device and output a signal having a frequency component different from that of the input signal.

The case of applying a current into a non-linear resistance r(i) will be discussed as a simplest example of performing the frequency conversion using the non-linear element. The current-voltage characteristic of the non-linear resistance can be provided with the Taylor expansion for $x = i - i_0$ around an operation point $(i_0, v_0)$ as the following expression.

$$v(x) = i_0 + \left(\frac{dv}{di}\right)_{i=i_0} x + \frac{1}{2}\left(\frac{d^2v}{di^2}\right)_{i=i_0} x^2 + \ldots \quad \text{[Formula 1]}$$
$$= i_0 + a_1 x + a_2 x^2 + a_3 x^3 + \ldots$$

When a current expressed by a sine wave of a frequency $\omega$ as $$x = m\cos\omega t \quad \text{[Formula 2]}$$

is applied into such a non-linear resistance element, a voltage generated across both ends of the element becomes

[Formula 3]

$$v = \quad (I)$$
$$i_0 + a_1 m\cos\omega t + \frac{1}{2}a_2 m^2(1 + \cos 2\omega t) + \frac{1}{4}a_3 m^3(3\cos\omega t + \cos 3\omega t) + \ldots$$

and it is possible to take out higher harmonic components such as $2\omega$ and $3\omega$ in addition to the $\omega$ component proportional to the input current utilizing output waveform distortion.

Next, there will be discussed another case in which a signal input into the non-linear element is the sum of signals having two frequencies $\omega_1$ and $\omega_2$ different from each other. When an input current is $$x = m_a \cos\omega_a t + m_b \cos\omega_b t \quad \text{[Formula 4]}$$

a voltage generated across both ends of the non-linear resistance element becomes $$v = i_0 + a_1 m_a \cos\omega_a t + a_1 m_b \cos\omega_b t + \quad \text{[Formula 5]}$$
$$\frac{1}{2}a_2 m_a^2(1 + \cos 2\omega_a t) + \frac{1}{2}a_2 m_b^2(1 + \cos 2\omega_b t) +$$
$$a_2 m_a m_b \{\cos(\omega_a + \omega_b)t + \cos(\omega_a - \omega_b)t\} + \ldots$$

and it is possible to take out a sum and a difference of the input signal frequencies; the sum $(\omega_1+\omega_2)$ and the difference $(\omega_1-\omega_2)$ In particular, a device obtaining the sum of the frequencies and a device obtaining the difference of the frequencies are called an up-converter and a down converter, respectively.

The generation of a signal having a frequency different from that of an input signal in this manner is called frequency conversion. The frequency conversion taking out the double frequency or integer multiple frequency of an input signal having a certain frequency as in Formula (I) is particularly called frequency multiplication, and the frequency conversion in the present invention includes the frequency multiplication.

The frequency conversion is an important technology. For example, the frequency conversion device is used for frequency mixing in a transmitter and a receiver in the radio communication field. Further, for the generation of a millimeter wave and sub-millimeter wave, a reasonable oscillator directly generating a signal having these frequency bands is not available and the generation is performed by a combination of a microwave oscillator and the frequency multiplication device.

Generally, the non-linear element used for the frequency conversion mainly utilizes a non-linear characteristic exhibited by a semiconductor device such as a diode and an FET. A schottky diode is frequently utilized as the frequency conversion device used for a microwave integrated circuit (MIC) which is formed by mounting discrete components on a dielectric substrate. Further, for the frequency conversion device used for the purpose of the frequency multiplication, the diode with reverse bias application is frequently utilized as a non-linear capacitance element (varactor).

There is known a monolithic microwave integrated circuit (MMIC) which is realized by collective and integrated fabrication of an active element, a passive element, and a passive-active element etc. on the same substrate by use of a semiconductor process. This MMIC uses an FET for an active device such as an amplifier and an oscillator, and thereby it is difficult to incorporate a diode designed dedicatedly for the frequency conversion into the MMIC from a restriction of production process compatibility. Therefore, the frequency conversion in the MMIC is frequently performed by the utilization of the non-linear characteristic of the FET itself. Further, when the frequency conversion device is incorporated in the MMIC, a circuit area is restricted from the view point of integration degree. Accordingly, the frequency conversion device is also expected to have a small scale.

The MMIC is broadly divided into an MMIC configured with a Si-series device and an MMIC configured with a compound semiconductor device. Although each of the Si-series device and the compound semiconductor device has both advantages and disadvantages, it is difficult to mixedly mount these devices on the same substrate in the monolithic microwave integrated circuit (MMIC). This is because a silicon substrate is used for the Si-series MMIC and a substrate such as GaAs is used for the compound semiconductor, since epitaxial growth is frequently necessary for a film deposition process for each of the devices. Production process compatibility is very poor between the Si-series device and the compound semiconductor device.

Further, in the frequency conversion device using a semiconductor, the frequency conversion device itself generally does not have a frequency selection capability. Accordingly, when trying to perform the frequency conversion only for a certain frequency, it is necessary to provide a filter or the like. In the frequency conversion device using the semiconductor, the frequency conversion itself cannot have a switching function.

Meanwhile, the giant magneto-resistance element (GMR) and the tunnel magneto-resistance element (TMR), which exhibit the magneto-resistance effect, have been developed for the application to a sensor or a memory device. Such an element utilizes a phenomenon that the resistance of a magneto-resistance element changes according to a relative angle of a magnetic moment between a magnetization free layer and a magnetization pinned layer in the magneto-resistance element. That is, the above giant magneto-resistance element or the tunnel magneto-resistance element utilizes a feature of detecting an external magnetic field change as a resistance change (sensor effect) and a feature of having resistance hysteresis reflecting magnetic hysteresis (memory effect). Further, recently there has been developed a device application utilizing spin injection torque in addition to the magneto-resistance effect. The spin injection torque is magnetic torque generated in a localized magnetic moment when angular momentum exchange occurs between a conduction electron and a localized electron by a spin-polarized current in a ferromagnetic body, as described in Non-patent document 1. Thereby, an application such as a microwave oscillator, a microwave detection device, and a microwave amplifier is being developed by the utilization of spin injection magnetization reversal in which magnetization reversal becomes possible without an external magnetic field or by the utilization of a non-linear effect caused by a precession movement of magnetization induced by the spin injection torque (refer to Patent document 1).

The operation principle of the microwave detection device shown in Non-patent document 3 is a homodyne detection method and it is possible to detect a DC voltage for one input AC signal. This device utilizes a non-linear effect in which the precession movement of the magnetic moment is caused by the spin torque induced by the AC signal applied to the magneto-resistance element, and the resistance value thereof changes periodically. The frequency of the resistance value change is equal to the frequency of the input AC signal and the effect expressed by Formula (I) appears. In Non-patent document 3, while the homodyne detection is performed utilizing this effect, another important technique is used. The technique utilizes a spin injection FMR effect. A minute AC signal provides a very small current value and also a very small induced precession movement of magnetization, and thereby an output DC voltage is very small. However, the magnetization precession movement is amplified by a resonance effect when the frequency of the input AC signal becomes close to a ferromagnetic resonance frequency. Thereby, it becomes possible to detect a larger DC voltage. The detection function using this magneto-resistance element is called a spin torque diode effect. In this manner, the ferromagnetic resonance is also caused by the spin injection torque and a sufficient non-linear effect can be obtained in the magneto-resistance element by the additional use of the ferromagnetic resonance, and thereby an application is expected in the microwave band.

Prior Art Document
Patent Document
Patent document 1: Japanese Patent Laid-Open No. 2006-295908
Non-Patent Document
Non-patent document 1: Slonczewski, J. C. Current-driven excitation of magnetic multilayers. J. Magn. Magn. Mater. 159, L1-L7 (1996).
Non-patent document 2: Tulapurkar, A. A. et al. Spin-torque diode effect in magnetic tunnel junctions. Nature 438, 339-342 (2005).

SUMMARY OF THE INVENTION

Since a frequency conversion device using a semiconductor device such as a semiconductor diode or FET has a wide frequency band, the frequency conversion device cannot perform frequency-selective frequency conversion. Further, it is not possible to cause the frequency conversion function itself to include a switching function.

The frequency conversion device using a conventional semiconductor device has a restriction of a usable material or device for each of the Si-series MMIC and the GaAs-series MMIC from a viewpoint of a production process. The present invention can provide a frequency conversion device capable of accommodating both of the Si-series MMIC and GaAs-series MMIC by use of a magneto-resistance element as a frequency conversion device.

A first aspect of the present invention is a frequency converter including: a frequency conversion device including a magneto-resistance element provided with a magnetization free layer, an intermediate layer, and a magnetization pinned layer; a magnetic field application mechanism for applying a magnetic field to the frequency conversion device; a local oscillator for applying a local oscillation signal to the frequency conversion device; and an input terminal electrically connected to the frequency conversion device for receiving an external input signal, wherein the local oscillator includes a magneto-resistance element capable of generating the local oscillation signal by outputting an AC voltage according to a resistance change thereof.

When the frequency of any one signal among a plurality of input signals exists near a magnetic resonance frequency of the magnetization free layer in the magneto resistance element, the precession movement of the magnetization is amplified by the spin injection torque and the frequency conversion of the input signal is performed by a resultant non-linearity of the element resistance. Since the frequency band of the magnetic resonance frequency is narrow, the frequency conversion is performed only when at least one input signal among the plurality of input signals input into the magneto-resistance, element has a frequency near the magnetic resonance frequency, and the frequency conversion is not performed when the frequency of the input signal comes out of the ferromagnetic resonance frequency band. By utilizing such an effect, the frequency-selective frequency conversion can be performed. Further, by changing a magnitude of a magnetic field applied to the frequency conversion device, it is possible to cause the frequency conversion effect to have a switching function.

The present invention provides a frequency conversion device utilizing the magnetic resonance frequency excited by the spin injection torque and thereby it becomes possible to perform the frequency conversion by selecting a particular frequency.

DESCRIPTION OF THE PREFERRED EMBODIMENTS

Figure 1:
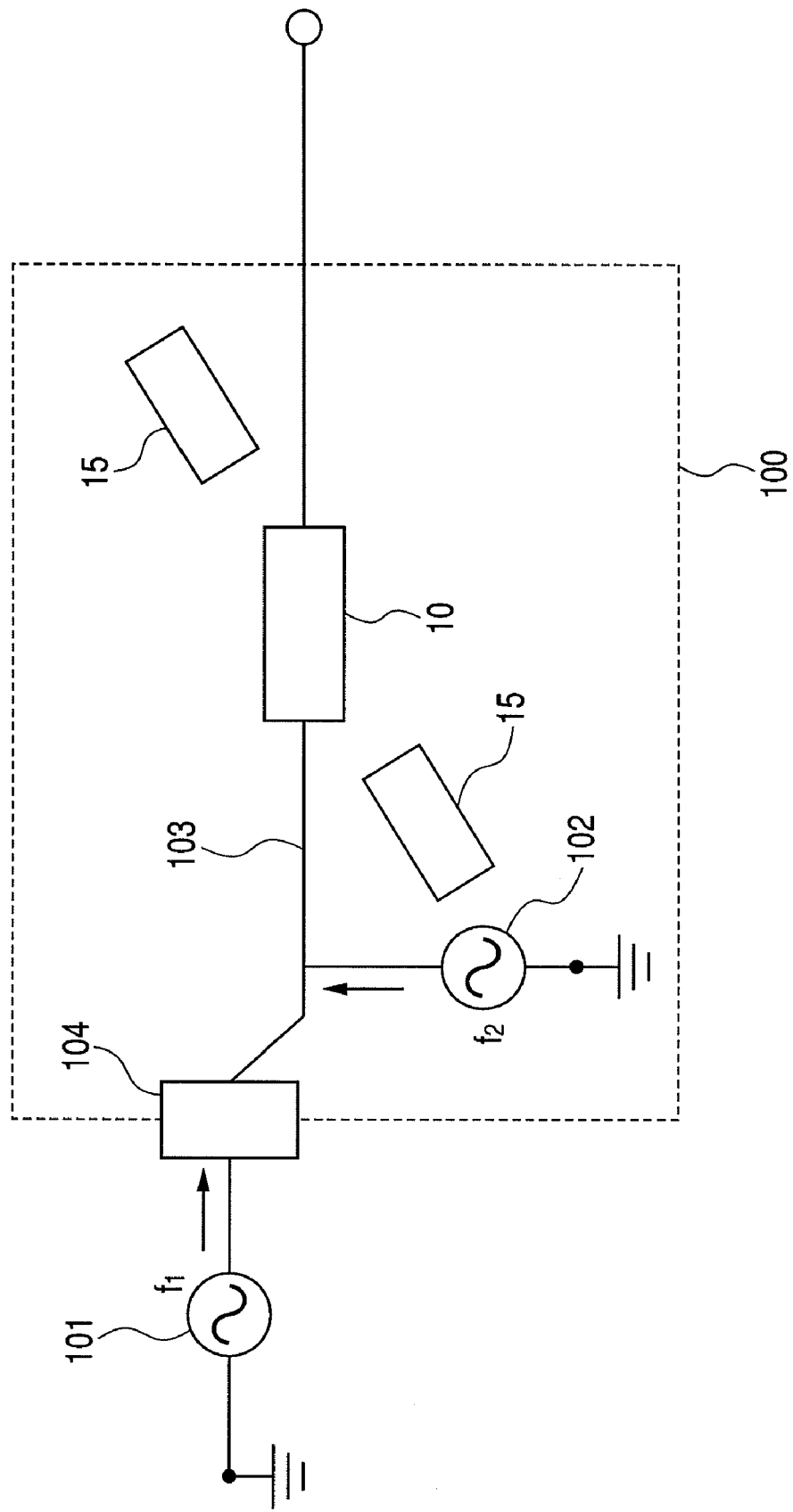
FIG. 1 is a schematic configuration diagram of a frequency converter provided with a frequency conversion device according to an embodiment of the present invention.

Hereinafter, embodiments of the present invention will be described in detail with reference to the drawings. Note that constituents having the same function are denoted by the same reference numeral in the drawing to be described below, and repeated description thereof will be omitted.

FIG. 1 shows an example of a frequency converter of the present invention. A frequency converter 100 includes: a frequency conversion device having a magneto-resistance element; a magnetic field application mechanism 15 applying a magnetic field to the frequency conversion device 10; a local oscillator 102 having a magneto-resistance element; an input terminal 104; and a wiring 103 electrically connecting the input terminal 104 and the local oscillator 102 to the frequency conversion device 10. The frequency converter 100 is an apparatus which outputs a difference signal between a high frequency signal $f_1$ input from an input signal source 101 and a high frequency signal $f_2$ applied by the local oscillator 102 from the frequency conversion device 10 and performs frequency conversion. Further, the frequency converter 100 is provided with the magnetic field application mechanism 15 for controlling the function of the frequency conversion device and this magnetic field application mechanism is configured with a permanent magnet, a coil, or the like in the present embodiment. However, the magnetic field application mechanism is not limited to this configuration as long as the mechanism can apply a magnetic field to the frequency conversion device 10.

The frequency conversion device 10 in the present embodiment of the invention is provided with the magneto-resistance element basically having a three-layer structure of a magnetization free layer (ferromagnetic layer), an intermediate layer, and a magnetization pinned layer (ferromagnetic layer). A material for the intermediate layer includes alumina, magnesium oxide, copper, and the like. Since non-linearity for obtaining a frequency conversion effect comes from an element resistance change caused by the magneto resistance effect, it is preferable to use a magneto resistance element having a large magneto-resistance ratio (MR ratio of 100% or larger).

Accordingly, a structure of the frequency conversion device using a tunnel magneto-resistance element having an MgO barrier wall as the intermediate layer will be described with reference to FIG. 2. Note that the magneto-resistance element to be used for the implementation of the present invention is not limited to the above magneto-resistance element.

Figure 2:
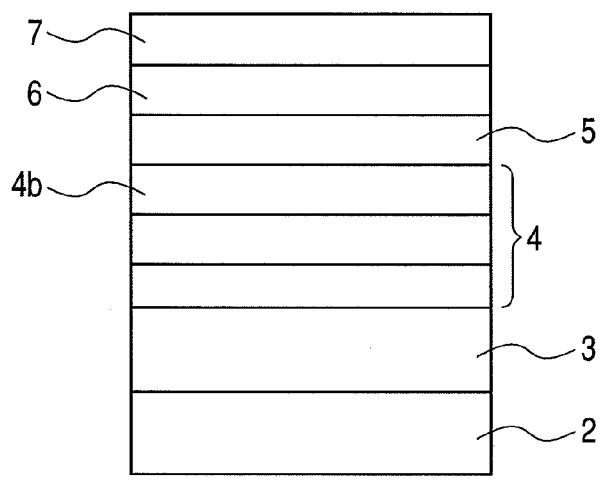
FIG. 2 is a schematic cross-sectional view of a frequency conversion device according to an embodiment of the present invention.

FIG. 2 is a schematic cross-sectional view of a frequency conversion device according to the present embodiment.

A specific configuration of each layer will be described with reference to FIG. 2. An anti-ferromagnetic layer 3 is formed on a lower electrode layer 2, and a magnetization pinned layer 4 is formed on the anti-ferromagnetic layer 3. In the magnetization pinned layer 4, reference numeral 4b indicates a layer corresponding to a magnetization pinned layer. A tunnel barrier layer (intermediate layer) 5 is formed on the magnetization pinned layer 4, a magnetization free layer 6 is formed on the tunnel barrier layer 5, and a protection layer 7 is formed on the magnetization free layer 6. In the present embodiment, the anti-ferromagnetic layer 3 is made of PtMn (15 nm). Further, the magnetization pinned layer is a laminated ferrimagnetic pinned layer made of CoFe (2.5 nm)/Ru (0.85 nm)/CoFeB (3 nm), and the CoFeB layer which is an upper layer of the laminated ferrimagnetic pinned layer corresponds to the magnetization pinned layer 4b. The tunnel barrier layer (intermediate layer) 5 is made of MgO (1.0 nm). The magnetization free layer 6 is made of CoFeB (2 nm). For the protection layer 7, a laminated structure of Ta (5 nm)/Ru (7 nm) is used. Here, ( ) indicates a thickness.

Although the thicknesses of the magnetization pinned layer and the magnetization free layer are set to be 3 nm and 2 nm, respectively in the present embodiment, the film thicknesses are not limited to these values. Similarly, the above film thicknesses are examples and the film thicknesses are not limited to these examples. Note that it is necessary to set the magnetic moment of the magnetization pinned layer to be larger than that of the magnetization free layer. This is because the precession movement is caused in the magnetization pinned layer by the spin injection torque if the magnetic moment of the magnetization pinned layer is smaller than that of the magnetization free layer.

The formation of the frequency conversion device is performed by a process of forming a magneto-resistance thin film into a pillar having a junction area of 1 μm² or smaller. It is better to make the junction area of the device smaller for applying the spin injection torque more effectively and the junction area preferably may have a size of 0.04 μm² or smaller.

Since a signal input into the frequency conversion device 10 is a high frequency signal, it is preferable to use a slot line, a micro-strip line, a coplanar waveguide, or the like, in which impedance matching is sufficiently taken into consideration, for the wiring 103. Further, preferably the impedance matching is also taken into consideration for the wiring 103 from the input signal source 101 to the frequency converter 100.

Figure 3:
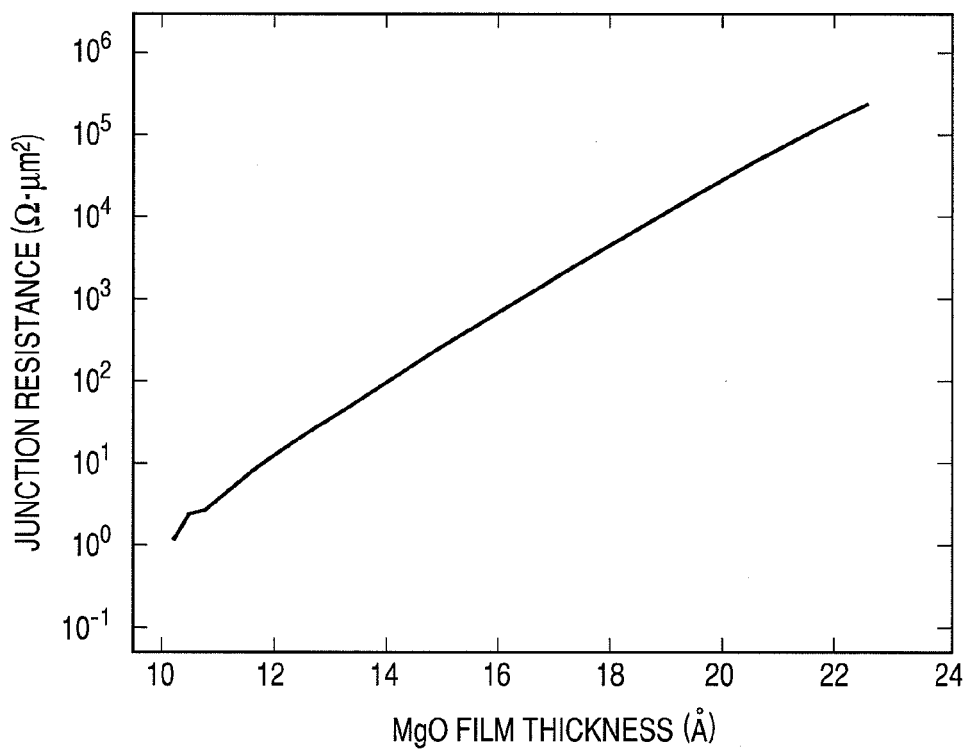
FIG. 3 is a graph for illustrating a relationship between an intermediate layer thickness and a junction resistance in a frequency conversion device according to an embodiment of the present invention.

It is preferable to provide the impedance matching to the frequency conversion device 10 itself. FIG. 3 is a graph for illustrating a relationship between an intermediate layer thickness and a junction resistance of the frequency conversion deice 10. It is possible to control the impedance of the frequency conversion device 10 by changing the size of the device and the thickness of the intermediate layer 5 in FIG. 2. For example, when magnesium oxide (MgO) is used for the intermediate layer, it is possible to control a normalized resistance value (normalized by an area of 1 μm×1 μm) of the device by changing the thickness of the magnesium oxide layer as shown in FIG. 3. Accordingly, it is possible to obtain a desired resistance value in a desired junction area by selecting the thickness of the magnesium oxide layer appropriately.

Further, it is possible to provide the impedance matching by changing the junction area of the device to control the device resistance while fixing the thickness of the intermediate layer 5 shown in FIG. 3.

Figure 4A:
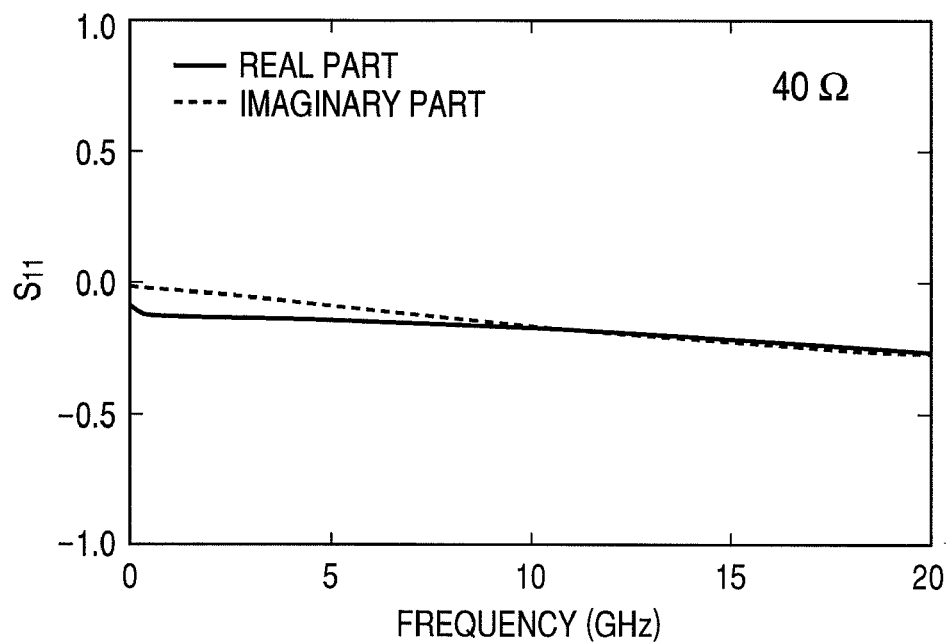
FIG. 4A is a graph for illustrating transmission characteristic evaluation by impedance matching in a frequency conversion device according to an embodiment of the present invention.
Figure 4B:
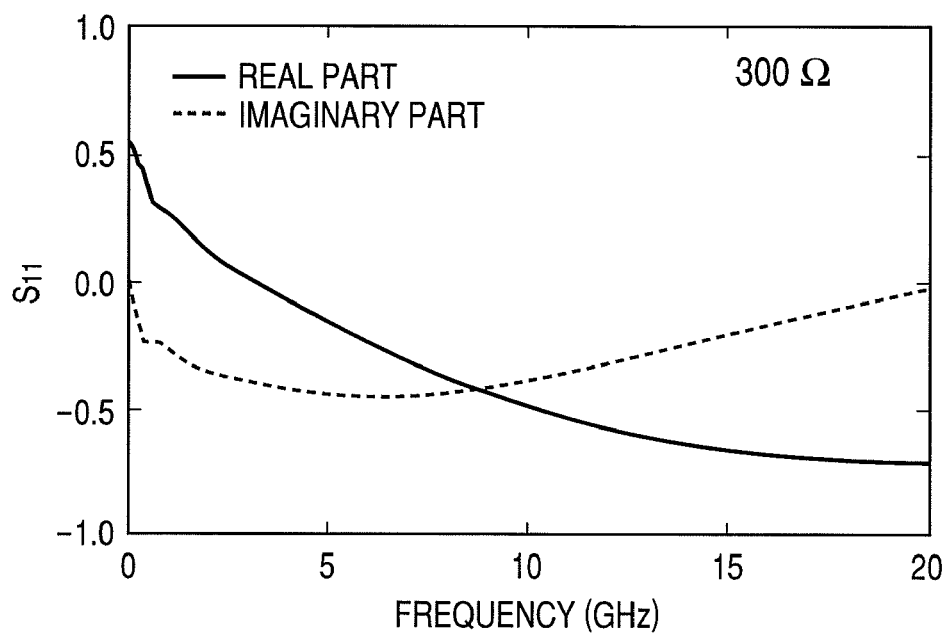
FIG. 4B is a graph for illustrating transmission characteristic evaluation by impedance matching in a frequency conversion device according to an embodiment of the present invention.

With reference to FIGS. 4A and 4B, transmission characteristic evaluation by the impedance matching will be described for the frequency conversion device according to the present embodiment.

Actually, the film thickness of MgO for the intermediate layer and the device size were changed and samples were prepared for device resistances of 40Ω and 300Ω, then the S11 (reflectance) measurement was carried out for each of the samples to evaluate the transmission characteristic thereof. The results are shown in FIGS. 4A and 4B. As shown by these results, it is apparent that the better transmission characteristic is obtained by the better impedance matching (FIG. 4A). While a transmission efficiency of 0.8 or higher is obtained for the sample of 40Ω in the device resistance across a whole frequency range from 0 to 20 GHz, the transmission efficiency is reduced to a value lower than 0.4 for the sample of 300Ω in the device resistance.

Next, the local oscillator 102 having a magneto-resistance element will be described with reference to FIG. 5A. The local oscillator 102 includes: a magneto-resistance element 30; a DC application terminal 32 for connecting a DC voltage source or a DC current source to the magneto-resistance element 30; a high frequency output terminal 33 for outputting a high frequency wave generated in the magneto-resistance element 30; and a bias T 31 for separating an AC component from a DC component.

Figure 5A:
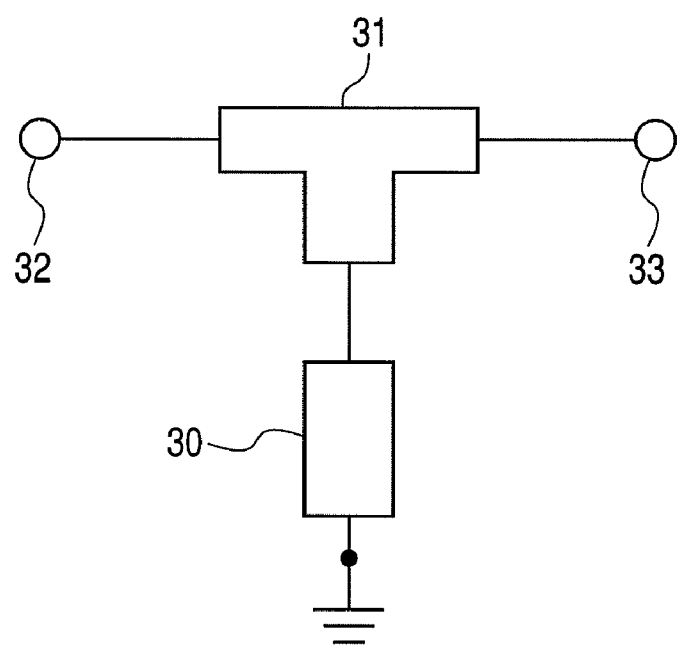
FIG. 5A is a schematic configuration diagram of a local oscillator according to an embodiment of the present invention.
Figure 5B:
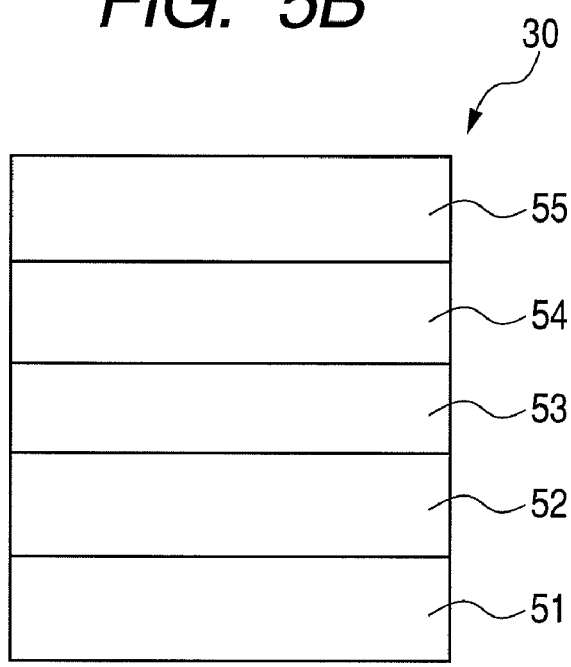
FIG. 5B is a schematic cross-sectional view of a magneto-resistance element included in the local oscillator according to an embodiment of the present invention.

FIG. 5B shows an example of the magneto-resistance element 30 included in the above local oscillator 102.

In FIG. 5B, a magnetization pinned layer 52 is formed on a lower electrode 51, an intermediate layer 53 is formed on the magnetization pinned layer 52, a magnetization free layer 54 is formed on the intermediate layer 53, and an upper electrode 56 is formed on the magnetization free layer 54.

In the present embodiment, a DC power source is provided to the magneto-resistance element 30 shown in FIG. 5B. That is, the lower electrode 51 is grounded and the upper electrode 55 is electrically connected to the DC application terminal 32 via the bias T 31. In such a configuration, when a DC voltage or a DC current is supplied to the magneto-resistance element 30, the magnetic moment in the magnetization free layer 54 included in the magneto-resistance element 30 is provided with the precession movement by the spin torque. The principle of this phenomenon is the same as that described in "Related Background Art" of this specification. The precession movement of the magnetic moment is periodic and a cycle thereof is the ferromagnetic resonance frequency. Along with the periodic movement in the magnetization free layer 54, an element resistance also changes periodically (because the element resistance is determined by the relative angle between the magnetization free layer 54 and the magnetization pinned layer 52).

When the resistance is changed periodically in a state in which a constant voltage or current is being applied, a current or voltage output from the magneto-resistance element 30 changes periodically. Since the resistance value and the current value or the resistance value and the voltage value change periodically at a frequency near the ferromagnetic resonance frequency, the magneto-resistance element 30 outputs high frequency power.

In the present invention, it is necessary to separate the microwave generated in the magneto-resistance element 30 from the direct current input into the magneto-resistance element 30. The bias T 31 is provided for separating DC and AC. Thereby, the direct current input from the DC application terminal 32 is applied only to the magneto-resistance element 30, and the high frequency wave generated in the magneto-resistance element 30 is output only from the high frequency output terminal 33.

That is, in FIG. 5B, when the local oscillator 102 generates a high frequency signal $f_2$ which is a local oscillation signal, a predetermined DC voltage (DC current) is input from the DC application terminal 32. The input DC voltage is input into the upper electrode 55 included in the magneto-resistance element 30 via the bias T 31. By the application of the DC voltage to this upper electrode 55, the magnetic moment of the magnetization free layer 54 is provided with the spin torque resulting in the periodical precession movement of the magnetic moment, and the resistance of the magneto-resistance element 30 also changes periodically along with the periodic precession movement. At this time, the magneto-resistance element 30 outputs the high frequency signal $f_2$ to the bias T 31 according to the above periodic change of the resistance value. When the high frequency signal $f_2$ is input from the magneto-resistance element 30, the bias T 31 outputs the high frequency signal $f_2$ to the high frequency output terminal 33 and the high frequency output terminal 33 outputs the high frequency signal $f_2$ to the frequency conversion device 10 via the wiring 103.

As an example for the present invention, the DC application terminal 32 of FIG. 5A was connected with a constant voltage source, a voltage of 0.6 V was applied to the magneto-resistance element 30, a spectrum analyzer was connected to the high frequency output terminal 33, and the power spectrum of the high frequency power generated in the magneto-resistance element 30 was measured. The result thereof is shown in FIG. 6.

Figure 6:
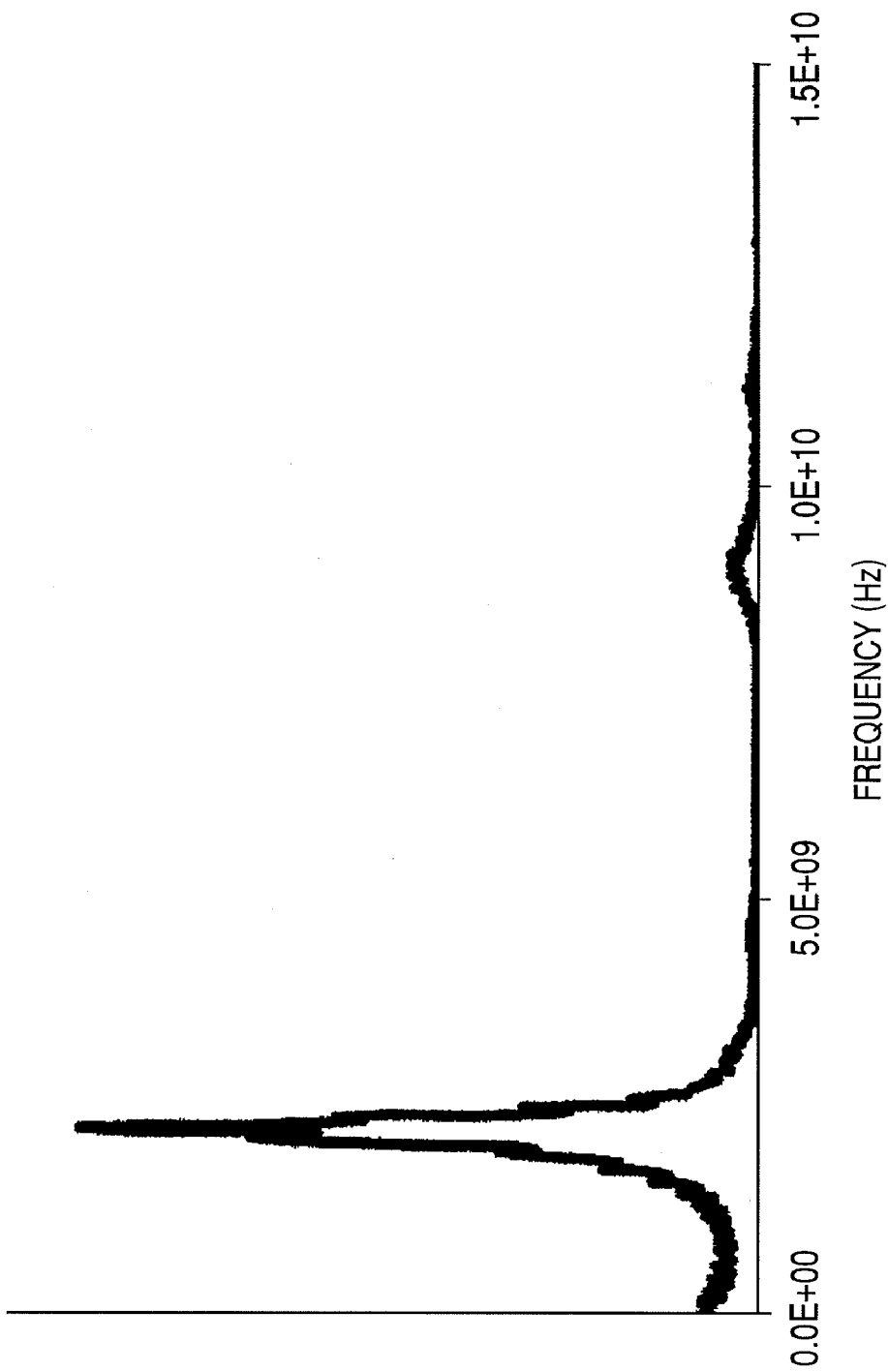
FIG. 6 is a diagram showing a power spectrum of a high frequency power generated from a magneto-resistance element included in a local oscillator according to an embodiment of the present invention.
Figure 7:
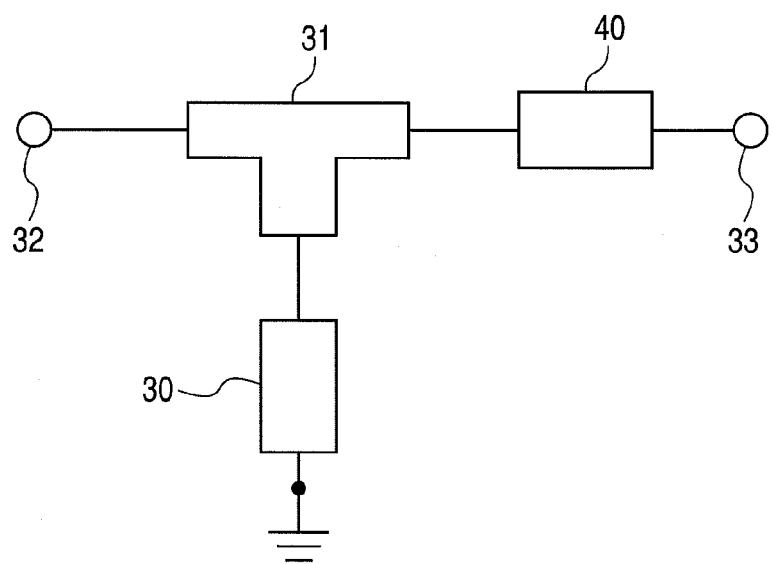
FIG. 7 is a schematic configuration diagram of a local oscillator according to an embodiment of the present invention.

As apparent from FIG. 6, the band width of the power spectrum in the magneto-resistance element 30 is approximately 350 MHz. Accordingly, for applying a spectrum having a narrower band width to the frequency conversion device 10, it is necessary to provide a band pass filter 40 between the bias T 31 and the high frequency output terminal 33 as shown in FIG. 7.

In this manner, in the present embodiment, since the magneto-resistance element 30 is used as an element generating the local oscillation signal of the local oscillator 102, it is possible to reduce the size of the entire frequency converter.

Further, in the present invention, the structure of the magneto-resistance element 30 is not limited to that shown in FIG. 5B.

As described above, an essence of the present invention is as follows; in the magneto-resistance element included in the local oscillator, the resistance of the above magneto-resistance element is changed (by an external factor such as a current or a magnetic field) and the above magneto-resistance element outputs an AC voltage(high frequency power) according to the resistance change. Accordingly, in the present invention, the magneto-resistance element having any structure may be used as long as the magneto-resistance element can output an AC voltage according to the resistance change thereof.

Next, there will be described an important feature of the frequency conversion device using the magneto-resistance element in an embodiment of the present invention that the frequency conversion device can be fabricated on any substrate without the restriction of the substrate material.

As an example, the normalized resistance value and the magneto-resistance ratio were compared between the frequency conversion device 10 fabricated on a silicon substrate and the frequency conversion device fabricated on a GaAs substrate. Table 1 shows the result. Comparable characteristics are obtained in the normalized resistance value and the magneto-resistance ratio between the frequency conversion device fabricated on the silicon substrate and the frequency conversion device fabricated on the GaAs substrate. Further, the frequency conversion devices were fabricated similarly on a silicon substrate with thermally-oxidized silicon, an ALTiC substrate (ceramics), an MgO substrate, a glass substrate, a sapphire substrate, and a silicon substrate with silicon nitride, and the normalized resistance values and the magneto-resistance ratios were compared. As a result, all the normalized resistance values are around 3Ω and the variations thereof fall in a range not more than 1Ω. All the magneto-resistance ratios are 100% or larger for all the frequency conversion devices. From these results, the use of the frequency conversion device according to the present invention is found not to have the restriction of the substrate material differently from that of the conventional semiconductor frequency converter.

TABLE 1

| | Normalized resistance | Magneto-resistance ratio |
| --- | --- | --- |
| Si | 3.2 Ω | 112% |
| Si + SiO$_2$ | 2.9 Ω | 108% |
| AlTiC | 2.8 Ω | 109% |
| GaAs | 2.9 Ω | 110% |
| MgO | 3.4 Ω | 102% |
| Glass substrate | 3.6 Ω | 106% |
| Sapphire substrate | 2.6 Ω | 101% |
| Si + SiN | 2.9 Ω | 106% |

When the frequency of any one signal among a plurality of signals input into the frequency conversion device 10 is included in the ferromagnetic resonance frequency band of the magnetization free layer 6 in the frequency conversion device 10, the precession movement of the magnetization is amplified by the spin injection torque and the frequency conversion of the input signal is performed by the resultant non-linearity of the device resistance. Since the frequency band of the ferromagnetic resonance frequency is narrow, the frequency conversion is performed only when at least one input signal has a frequency in a band near the ferromagnetic resonance frequency among the plurality of input signals input into the magneto resistance element provided to the frequency conversion device 10, and the frequency conversion is not performed when all the frequencies of the input signals come out of the ferromagnetic resonance frequency band. Therefore, for the realization of the frequency conversion using the frequency conversion device 10 employing the magneto-resistance element, at least one of the input signals needs to have a frequency included in the ferromagnetic resonance frequency band.

Figure 8:
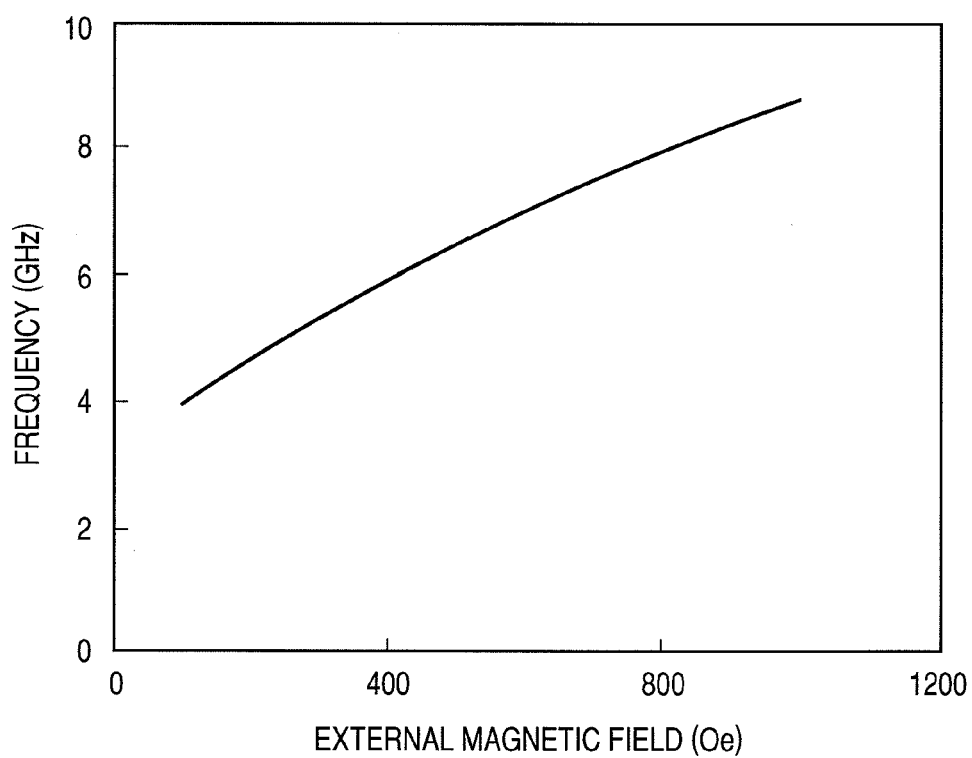
FIG. 8 is a graph for illustrating an external magnetic field dependence of a ferromagnetic resonance frequency in a frequency conversion device according to an embodiment of the present invention.

Although this ferromagnetic resonance frequency band of the magnetization free layer 6 is a parameter depending on the material, the frequency band can be changed by the application of an external magnetic field to the magnetization free layer 6 in FIG. 2. For example, FIG. 8 shows an external magnetic field dependence of the ferromagnetic resonance frequency in the frequency conversion device 10 fabricated at this time. The spin torque diode effect was utilized for the measurement of the ferromagnetic resonance frequency. As shown in this result, by applying an external magnetic field, it is possible to change the ferromagnetic resonance frequency approximately from 2 GHz to 9 GHz. This result is an example and further a higher resonance frequency can be obtained by the application of a larger magnetic field.

Figure 9:
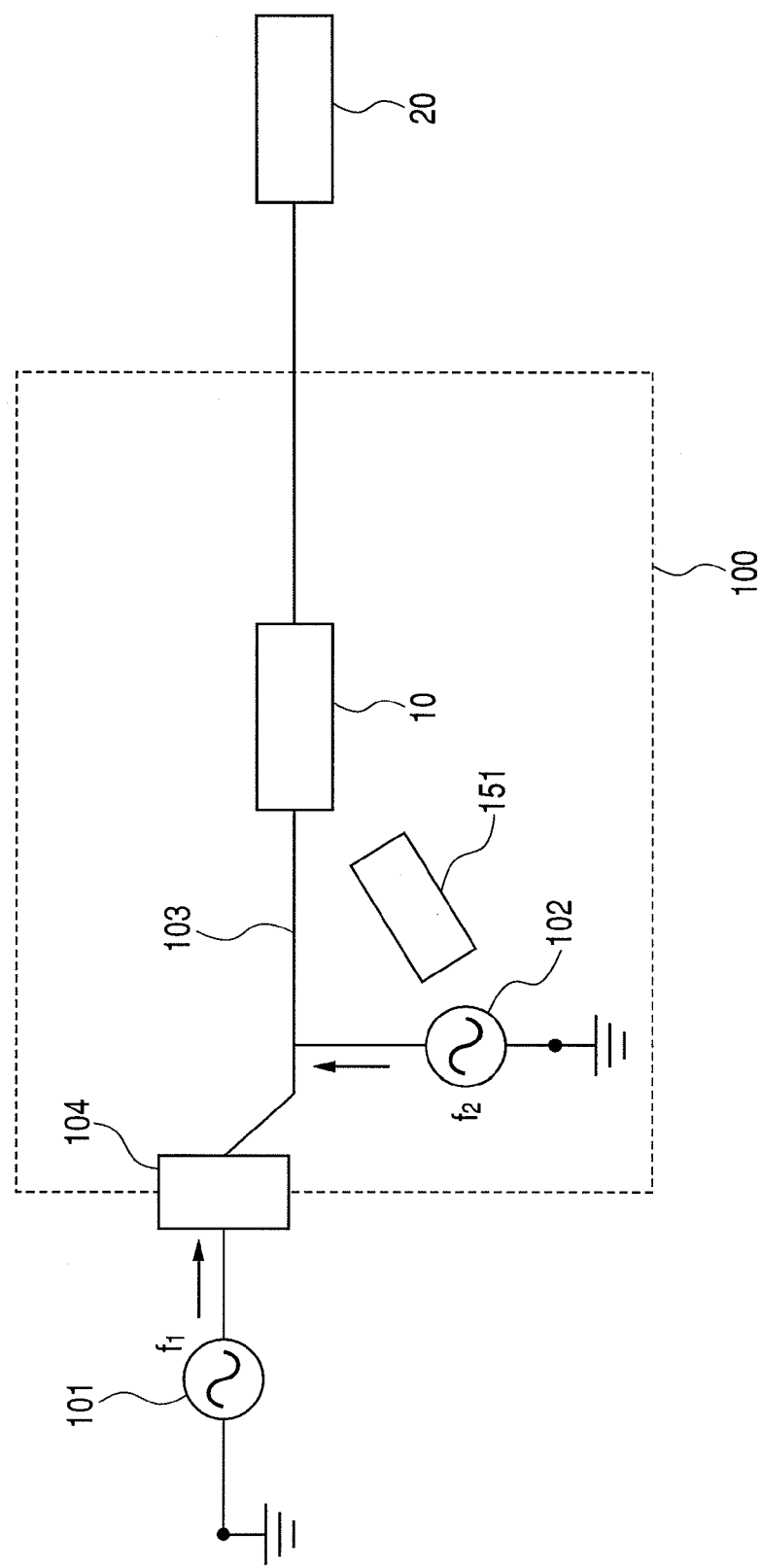
FIG. 9 is a schematic configuration diagram of a frequency converter provided with a frequency conversion device according to an embodiment of the present invention.

FIG. 9 is a schematic configuration diagram of a second frequency converter provided with the frequency conversion device. As shown in FIG. 9, a permanent magnet 151 is disposed at a position in a distance where an appropriate external magnetic field is applied to the frequency conversion device 10 and the disposition position of the permanent magnet 151 is set so that the ferromagnetic resonance frequency is 4.72 GHz. Note that the external magnetic field is applied in a direction in which the magnetizations prefer to be parallel to each other between the magnetization pinned layer 4 and the magnetization free layer 6 and also in a direction inclined by 30 degrees from the easy axis direction of the magnetization pinned layer 4. Although the application direction of the external magnetic field has an angle of 30 degrees in this embodiment, the application direction may have any angle except zero degrees and 180 degrees. The reason is as follows; in the case of zero degrees or 180 degrees in the applied magnetic field direction, the magnetization of the magnetization free layer 6 has a rotationally symmetric movement in the precession movement having a rotation axis in the easy axis direction of the magnetization pinned layer 4, and thereby the relative angle of the magnetic moment between the magnetization free layer 6 and the magnetization pinned layer 4 is not changed substantially and the resistance change of the magneto-resistance element does not occur.

Note that, although only one permanent magnet 151 is disposed on one side of the frequency converter in FIG. 9, the permanent magnets 151 may be disposed on both sides thereof.

The high frequency signal $f_1$ of 3 GHz is input into the frequency converter 100 from the input signal source 101 and the high frequency signal $f_2$ of 4.72 GHz is input into the frequency conversion device 10 from the local oscillator 102. As shown in FIG. 9, the magnetic field is applied to the frequency conversion device 10 by the permanent magnet 151 so that the ferromagnetic resonance frequency is 4.72 GHz. Therefore, the frequency conversion device 10 outputs a difference signal having a frequency difference between 3 GHz (high frequency signal $f_1$) and 4.72 GHz (high frequency signal $f_2$). A spectrum analyzer 20 is connected to the output side of the frequency converter 100 for observing this output.

Figure 10:
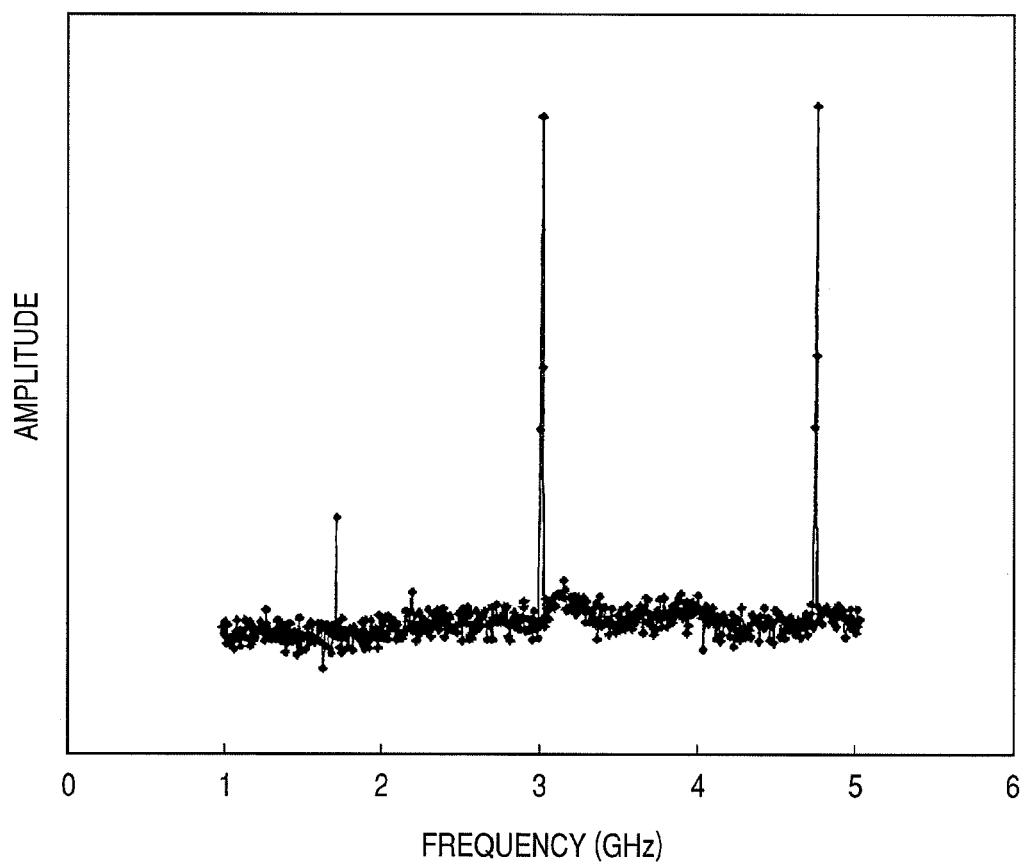
FIG. 10 is a diagram showing a result of frequency conversion using the frequency converter shown in FIG. 9.

FIG. 10 shows the output signal observed by the spectrum analyzer 20. The frequency conversion is found to be realized from the observation of a signal of 1.72 GHz which corresponds to the difference signal between the input signal of 3 GHz (high frequency signal $f_1$) and the local oscillation signal of 4.72 GHz (high frequency signal $f_2$).

Figure 11:
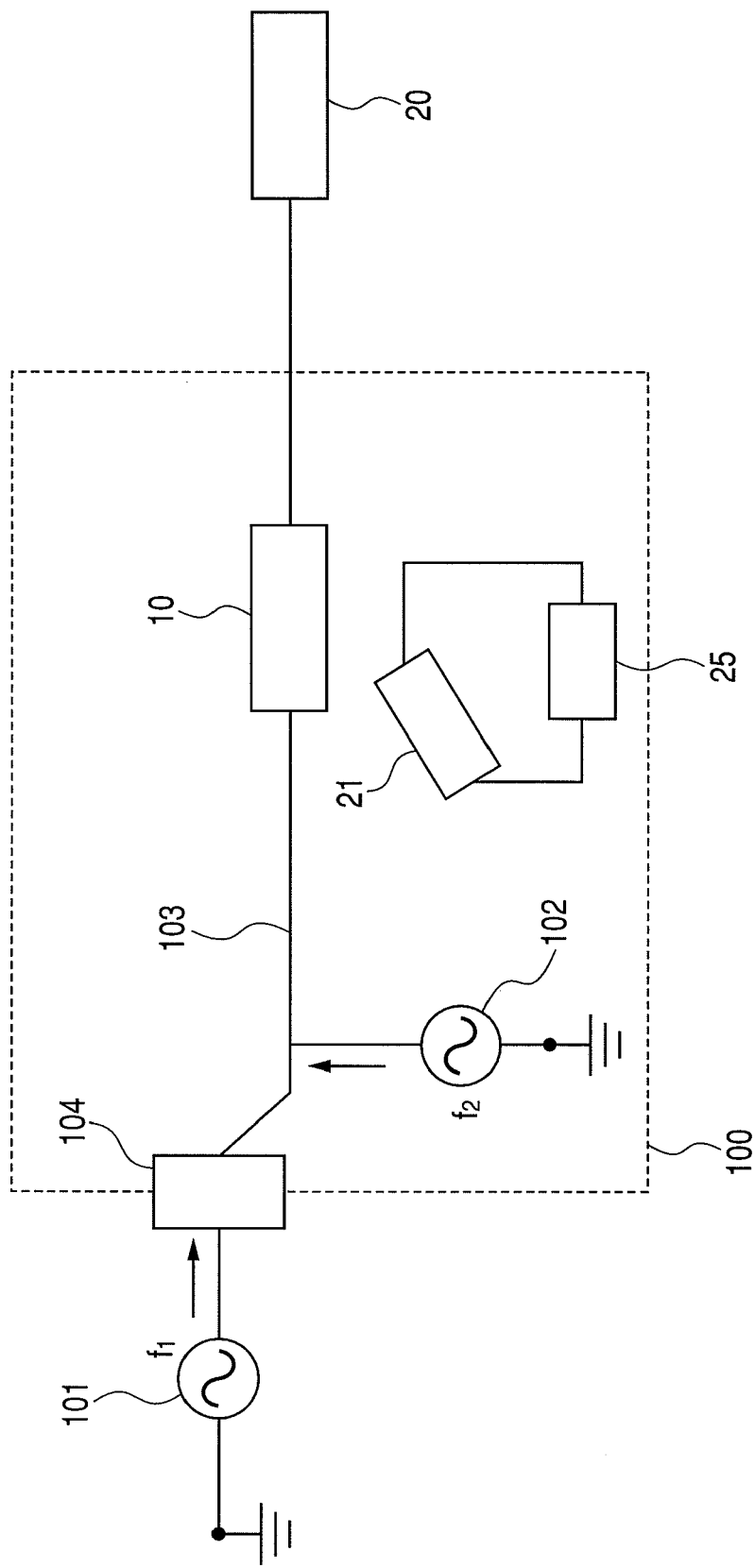
FIG. 11 is a schematic configuration diagram of a frequency converter provided with a frequency conversion device according to an embodiment of the present invention.

FIG. 11 is a schematic configuration diagram of a third frequency converter provided with the frequency conversion device. Although the permanent magnet 151 is used for the magnetic field application mechanism 15 in the embodiment shown in FIG. 9, a coil 21 may be disposed as shown in FIG. 11 for applying a current-induced magnetic field to the frequency conversion device 10. In this case, a magnetic field strength can be controlled not only by the disposition position of the coil 21, but also a current magnitude applied to the coil 21 and a winding number of the coil 21. Accordingly, it is preferable to provide a control power source (controller) 25 for controlling a current flowing through the coil 21. Further, although the present embodiment uses the coil 21, the current-induced magnetic field can be realized by using another method in addition to the coil such as a method of using a simple electric wiring. Further, although the coil is disposed on one side of the frequency conversion device 10 in FIG. 11, the coils may be disposed on both sides thereof.

Further, when the coil 21 is used as a mechanism for applying a magnetic field to the frequency conversion device as in FIG. 11, it is possible to change the strength of the induced magnetic field by changing the current magnitude applied to the coil 21. Utilizing this method, it is possible to change the ferromagnetic resonance frequency of the frequency conversion device 10.

Figure 12:
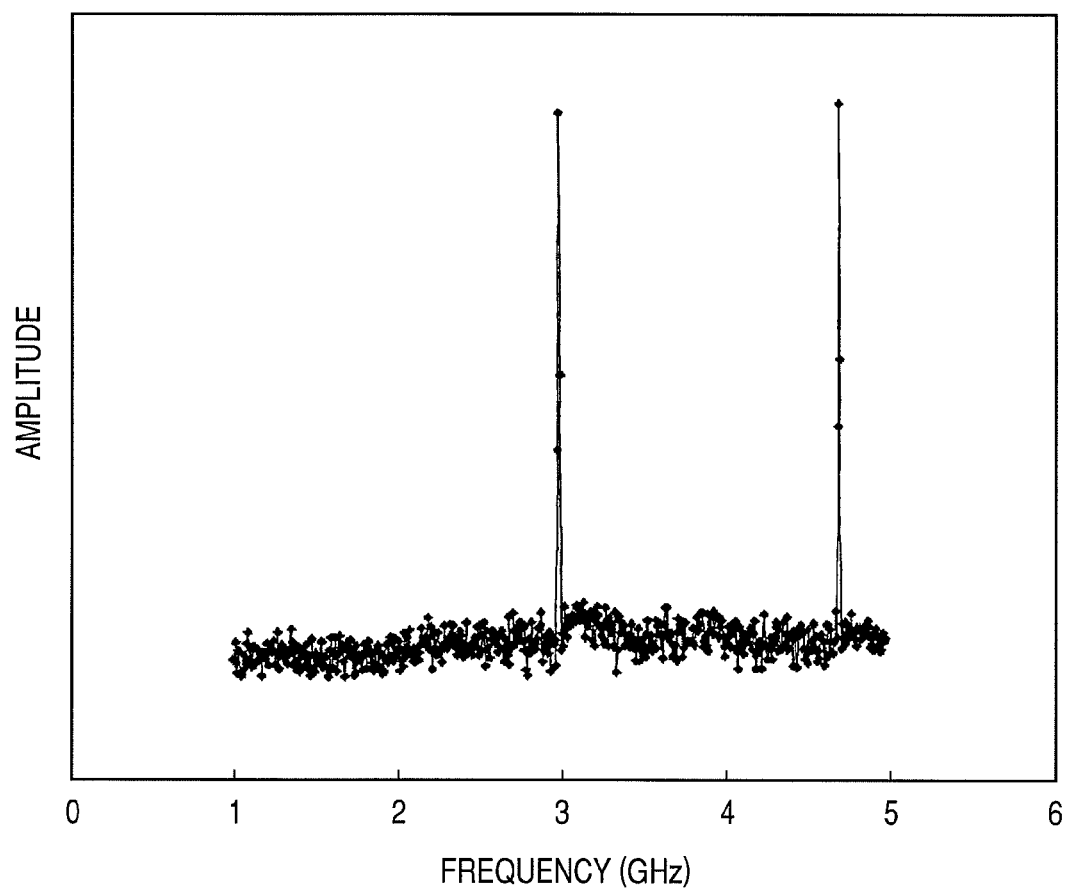
FIG. 12 is a diagram for illustrating a method to provide a switching function to a frequency converter according to an embodiment of the present invention.

Next, there will be described a method of causing the frequency converter according to the present invention to have a switching function. While the signals of 3 GHz (high frequency signal $f_2$) and 4.72 GHz (high frequency signal $f_2$) are being input into the frequency conversion device 10, the permanent magnet 151 shown in FIG. 9 is moved to make the direction of the external magnetic field parallel to the easy axis direction of the magnetization pinned layer 4 (angle: zero degrees). Then, the spectrum at 1.72 GHz of the difference signal frequency is not observed and the frequency conversion effect is not obtained (refer to FIG. 12). This is probably because the center axis of the magnetization precession movement is aligned with the easy axis and thereby the resistance change cannot be obtained.

Further, the difference signal frequency disappears similarly when the magnetic field application direction is made to be anti-parallel (angle: 180 degrees) to the easy axis direction of the magnetization pinned layer 4. In this manner, by setting the applied magnetic field direction to be zero degrees or 180 degrees against the easy axis of the magnetization free layer 4, it is possible to switch off the frequency conversion effect. In this manner, the frequency converter of the present invention can have a switching function switching the existence and non-existence of the frequency conversion by moving the permanent magnet 151 applying the external magnetic field to the frequency conversion device 10 and thereby controlling the external magnetic field applied to the frequency conversion device 10.

There are two methods for switching the frequency conversion function.

One is a method in which a state having the frequency conversion effect under an appropriate external magnetic field constantly applied to the frequency conversion device 10 (switching-on) is switched to a state without the frequency conversion effect (switching-off) by the change of this external magnetic field, or in which the frequency of the frequency-converted signal is shifted from a desired frequency band by the shift of the ferromagnetic resonance frequency band. This method is defined as "normally-on" since these are states in which the frequency conversion function works in a normal state.

Figure 13:
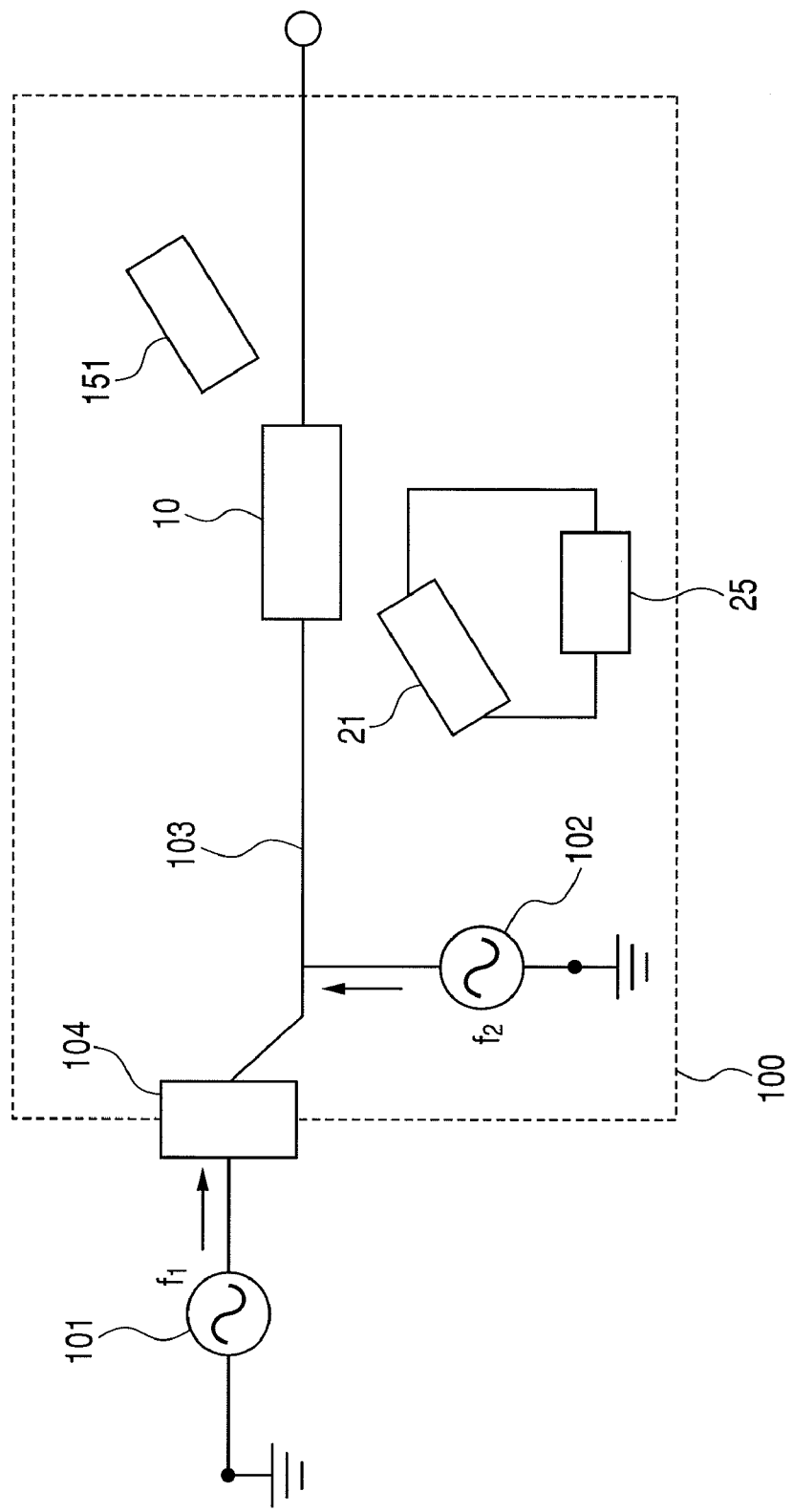
FIG. 13 is a schematic configuration diagram of a frequency converter provided with a frequency conversion device according to an embodiment of the present invention.

FIG. 13 is a schematic configuration diagram of a fourth frequency converter provided with the frequency conversion device. For realizing a "normally-on" frequency converter, it is preferable to dispose a mechanism applying two magnetic fields around the frequency conversion device 10 as shown in FIG. 13. In the embodiment shown in FIG. 13, the coil 21 of an electromagnet and the permanent magnet 151 are disposed around the frequency conversion device 10 for applying magnetic fields to the frequency conversion device 10.

In particular, since the external magnetic field needs to be changed for obtaining the switching-off state, it is necessary to cause at least one of the two magnetic field application mechanisms to generate a controllable magnetic field such as the current-induced magnetic field like the coil 21.

In generating the magnetic field necessary for realizing "normally-on", the power consumption can be reduced by the use of the permanent magnet 151. This is because the permanent magnet 151 may be just disposed around the frequency conversion device 10 while the coil or the like requires electric power for generating the current-induced magnetic field.

Meanwhile, when a frequency in the frequency conversion is made to be variable by the change of the ferromagnetic resonance frequency in the frequency conversion device 10, the current-induced magnetic field by the coil or the like is necessary for generating a magnetic field necessary for realizing "normally-on".

Further, when the current-induced magnetic field by the coil or the like is used for realizing "normally-on", there is another method which does not use the two magnetic field application mechanisms for realizing the switching-off state. The method is realized by the use of the frequency conversion device 10 in which the magnetization free layer 6 has uniaxial magnetic anisotropy and the magnetic anisotropy direction of the magnetization pinned layer 4 is the same as the easy axis direction. The reason is as follows. When the current applied to the coil or the like is shut down in the switching-on state, the magnetic field comes not to be applied to the frequency conversion device 10. Accordingly, the magnetic moment of the magnetization free layer 6 is directed in the easy axis direction and becomes parallel or anti-parallel to that of the magnetization pinned layer 4, and the switching-off state can be realized.

The other switching method is a method in which the switching-on state is obtained only when the frequency conversion function is necessary during the switching-off state in the normal operation state. This method is defined as "normally-off" since the frequency conversion function is in the switching-off state during the normal operation state.

For realizing "normally-off", it is necessary to utilize the current-induced magnetic field by the coil or the like. The magnetic field is not applied to the frequency conversion device 10 in the normal operation state and the external magnetic field is applied to the frequency conversion device 10 by the application of a current through the coil or the like for the switching-on state. Thereby, the frequency conversion device 10 comes to have the state of obtaining the frequency conversion effect. When the frequency of the frequency conversion is desired to be variable, it is necessary that the current-induced magnetic field generated by the coil or the like is made to be controllable.

There will be shown an example in which the coil 15 is disposed around the frequency conversion device 10 and the frequency conversion effect is provided with the switching operation.

The current value applied to the coil 21 for generating the current-induced magnetic field is set so that the ferromagnetic resonance frequency of the frequency conversion device 10 becomes 4.72 GHz. The coil 21 is disposed in a direction in which the magnetization free layer 6 prefers the parallel and also inclined by 30 degrees from the easy axis of the magnetization pinned layer 4. When signals of 3 GHz (high frequency signal $f_2$) and 4.72 GHz (high frequency signal $f_2$) were input into the frequency conversion device 10 in this state (normally-on), a difference signal frequency of 1.72 GHz was observed the same as in FIG. 10.

When the current applied to the coil 21 is shut down in this state by turning-off of the coil control power source 25, the signal of 1.72 GHz which is the difference signal of the input signals disappeared. In this manner, it is possible to realize "normally-on" by controlling the current value applied to the coil 21.

Further, when the current was applied to the coil 21 by the turning-on of the coil control power source 25 in the state in which the current had not been applied to the coil 21, the signal of 1.72 GHz which was the difference signal frequency appeared. This is "normally-off" operation.

In this manner, it is possible to realize a frequency converter which can accommodate both of "normally-on" and "normally-off" by appropriately selecting the magnetic field application mechanism.

Figure 14:
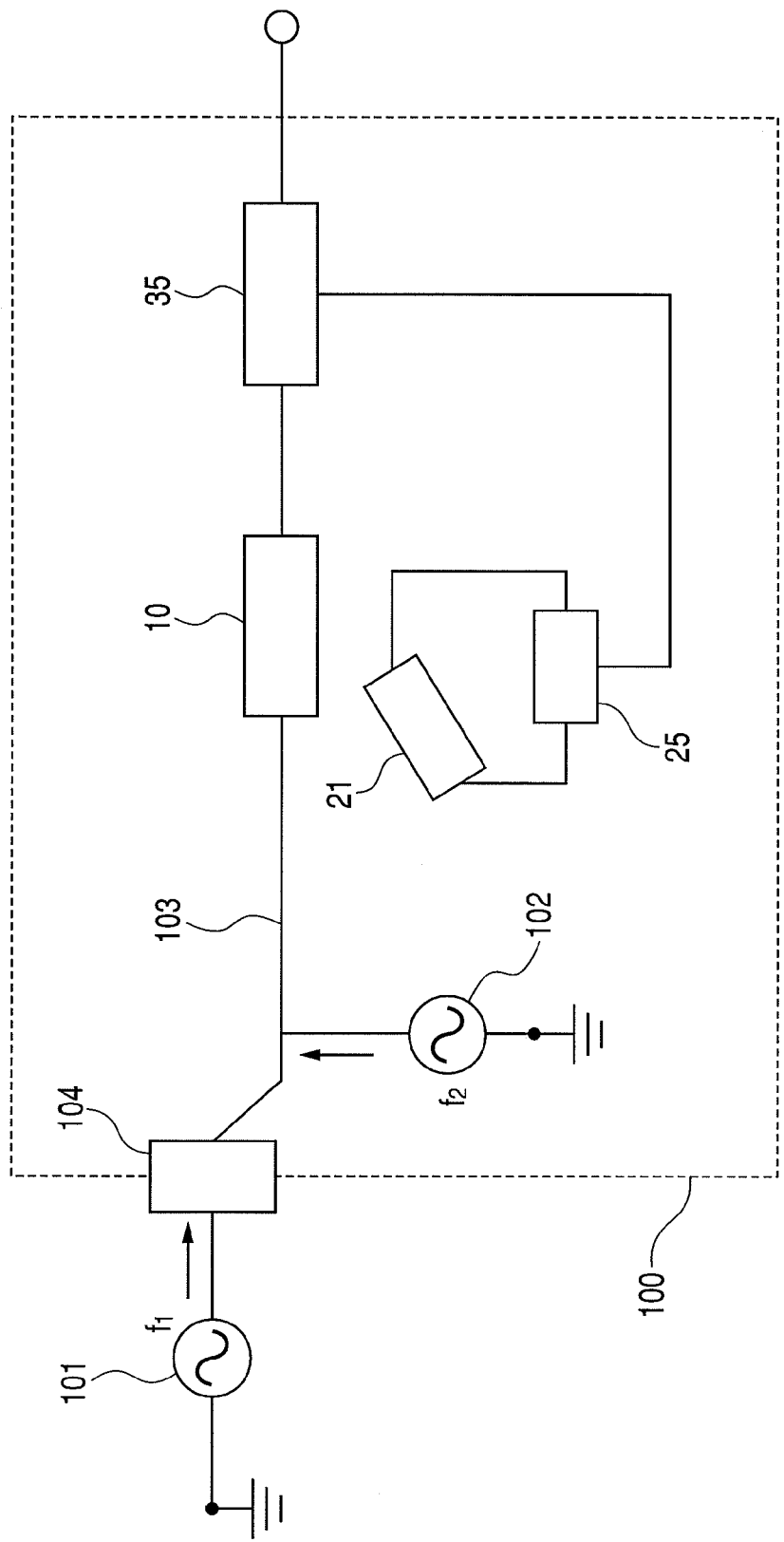
FIG. 14 is a schematic configuration diagram of a frequency converter provided with a frequency conversion device according to an embodiment of the present invention.

FIG. 14 is a schematic configuration diagram of a fifth frequency converter provided with the frequency conversion device.

As shown in FIG. 14, the coil 21 and the control power source (controller) 25 which can control the current applied to the coil 21 are disposed near the frequency conversion device 10. Further, a feedback circuit 35 electrically connected to the frequency conversion device 10 on the output side and also electrically connected to the coil control power source 25 is disposed.

The local oscillation signal of the ferromagnetic resonance frequency to be set is input from the local oscillator 102 and the high frequency signal is input from the external signal source 101, into the frequency conversion device 10. For example, the ferromagnetic resonance frequency and the external input signal frequency are set to be 4 GHz and 3.8 GHz, respectively. Then, a signal of 0.2 GHz is to be output from the frequency conversion device 10. This output signal is detected by the feedback circuit 35. When the difference signal frequency is not output correctly, the feedback circuit 35 controls the magnitude of the current-induced magnetic field generated in the coil 21 by providing feedback to the control power source (controller) 25 and can perform the setting so as to obtain a desired output. In this manner, it is possible to provide an adjustment function of the conversion frequency to the frequency conversion device by using the feedback circuit.

Note that another signal, in addition to the signal of 4 GHz, to generate the difference signal frequency of 0.2 GHz for 3.8 GHz, is a signal of 3.6 GHz. Therefore, by the above adjustment process at one time, it cannot be determined whether the set ferromagnetic resonance frequency is 4 GHz or 3.6 GHz. Accordingly, the above adjustment process is performed again by setting the external input signal frequency to be a frequency except 3.8 GHz. For example, the frequency of the external input signal $f_1$ is set to be 3.4 GHz. If the ferromagnetic resonance frequency is set to be 4 GHz by the above adjustment process, the frequency conversion device 10 outputs a signal of 0.6 GHz. However, if the ferromagnetic resonance frequency set by the above adjustment process is 3.6 GHz, a signal of 0.2 GHz is output. In this case, the adjustment process is to be repeated again. Therefore, it is preferable to mount a memory device on the feedback circuit 35 or the coil control power source 25.

Although the signal of the ferromagnetic resonance frequency is output from the local oscillator in the present embodiments, the output signal of an external signal source may be used as the signal of the ferromagnetic resonance frequency.

What is claimed is:

1. A frequency converter, comprising:
 a frequency conversion device including a magneto-resistance element provided with a magnetization free layer, an intermediate layer, and a magnetization pinned layer;
 a magnetic field application mechanism for applying a magnetic field to the frequency conversion device;
 a local oscillator for applying a local oscillation signal to the frequency conversion device; and
 an input terminal electrically connected to the frequency conversion device for receiving an external input signal,
 wherein
 the local oscillator includes a magneto-resistance element capable of generating the local oscillation signal by outputting an AC voltage according to a resistance change thereof.

2. A frequency converter according to claim 1, wherein
 the magnetic field application mechanism is a permanent magnet, and
 the magnetic field applied by the permanent magnet is not directed in parallel to an easy axis direction of the magnetization pinned layer in the frequency conversion device.

3. A frequency converter according to claim 1, wherein the magnetic field application mechanism includes:
 a current magnetic field application mechanism for generating a current magnetic field; and
 a power source applying a current to the current magnetic field application mechanism, and wherein
 the magnetic field applied by the current magnetic field is not directed in parallel to an easy axis direction of the magnetization pinned layer in the frequency conversion device.

4. A frequency converter according to claim 3, further comprising
 a controller controlling the magnetic field applied to the frequency conversion device by controlling the current applied to the current magnetic field application mechanism.

5. A frequency converter according to claim 4, still further comprising
 a feedback circuit detecting an output of the frequency conversion device and providing feedback to the controller so as to obtain a desired ferromagnetic resonance frequency.

6. A frequency converter according to claim 4, wherein
 the controller turns on/off the magnetic field applied to the frequency conversion device by turning on/off the current applied to the current magnetic field application mechanism.

* * * * *